United States Patent
Suzuki et al.

(10) Patent No.: US 11,207,725 B2
(45) Date of Patent: Dec. 28, 2021

(54) HOT FORGING DIE AND MANUFACTURING PROCESS FOR FORGED PRODUCT USING THE SAME, AND MANUFACTURING PROCESS FOR HOT FORGING DIE

(71) Applicant: HITACHI METALS, LTD., Tokyo (JP)

(72) Inventors: Shogo Suzuki, Yasugi (JP); Tomonori Ueno, Yasugi (JP); Cyuya Aoki, Yasugi (JP)

(73) Assignee: HITACHI METALS, LTD., Tokyo (JP)

( * ) Notice: Subject to any disclaimer, the term of this patent is extended or adjusted under 35 U.S.C. 154(b) by 303 days.

(21) Appl. No.: 15/763,992

(22) PCT Filed: Sep. 28, 2016

(86) PCT No.: PCT/JP2016/078611
§ 371 (c)(1),
(2) Date: Mar. 28, 2018

(87) PCT Pub. No.: WO2017/057453
PCT Pub. Date: Apr. 6, 2017

(65) Prior Publication Data
US 2018/0290202 A1 Oct. 11, 2018

(30) Foreign Application Priority Data

Sep. 29, 2015 (JP) .............................. JP2015-191750
Mar. 28, 2016 (JP) .............................. JP2016-063818
Jun. 8, 2016 (JP) .............................. JP2016-114023

(51) Int. Cl.
*B21J 13/02* (2006.01)
*C22C 19/03* (2006.01)
(Continued)

(52) U.S. Cl.
CPC ............... *B21J 13/02* (2013.01); *C22C 19/03* (2013.01); *C23C 14/0641* (2013.01); *C23C 14/5806* (2013.01)

(58) Field of Classification Search
CPC ............ B21D 37/00; B21D 37/01; C22F 1/10
(Continued)

(56) References Cited

U.S. PATENT DOCUMENTS

| 4,183,236 A * | 1/1980 | Spiegelberg ............... B21J 3/00 72/42 |
| 4,212,189 A * | 7/1980 | Fuchs ...................... B21K 5/20 72/478 |

(Continued)

FOREIGN PATENT DOCUMENTS

| JP | 60-221542 A | 11/1985 |
| JP | 62-50429 A | 3/1987 |

(Continued)

OTHER PUBLICATIONS

International Search Report with English language translation, International Application No. PCT/JP2016/078611, dated Nov. 8, 2016, 5 pp.

(Continued)

*Primary Examiner* — Adam J Eiseman
*Assistant Examiner* — Stephen Floyd London
(74) *Attorney, Agent, or Firm* — Myers Bigel, P.A.

(57) ABSTRACT

To provide a hot forging die made of a Ni-based superalloy, which is free from any deteriorations in working environment and die shape during hot forging in the air, and also provide a manufacturing process for a forged product using the same and a manufacturing process for a hot forging die. The hot forging die includes: a base body made of a Ni-based superalloy consisting of, by mass, 10.3 to 11.0% of W, 9.0 to 11.0% of Mo, and 5.8 to 6.8% of Al and balance (Continued)

of Ni with inevitable impurities; and a coating layer of inorganic material that is formed on at least one of a forming surface and a side surface of the die and contains 30 mass % or more in total of one or more of Si, Cr, and Al out of Si and metal elements.

5 Claims, 6 Drawing Sheets

(51) Int. Cl.
*C23C 14/06* (2006.01)
*C23C 14/58* (2006.01)

(58) Field of Classification Search
USPC .......................... 72/462; 148/675, 676, 677
See application file for complete search history.

(56) References Cited

U.S. PATENT DOCUMENTS

| | | | |
|---|---|---|---|
| 4,740,354 A | | 4/1988 | Watanabe et al. |
| 5,476,134 A | * | 12/1995 | Whittle ............... B22C 3/00 164/113 |
| 6,758,662 B2 | * | 7/2004 | Sugaya ............... B22F 3/03 425/355 |
| 2003/0059632 A1 | * | 3/2003 | Inoue ............... C23C 30/005 428/457 |
| 2005/0173834 A1 | * | 8/2005 | Lucek ............... B29C 33/56 264/319 |
| 2008/0093047 A1 | * | 4/2008 | Ma ............... B22C 9/061 164/72 |
| 2008/0233374 A1 | * | 9/2008 | Lechthaler ............ C23C 14/024 428/216 |
| 2010/0132429 A1 | * | 6/2010 | Murakami ............. C21D 6/004 72/462 |
| 2011/0016946 A1 | * | 1/2011 | Brahmandam ........ B21D 37/01 72/462 |
| 2012/0114971 A1 | * | 5/2012 | Andler ............... B22F 7/04 428/647 |
| 2012/0131980 A1 | | 5/2012 | Yamamoto |
| 2013/0167606 A1 | * | 7/2013 | Winkler ............... C22C 16/00 72/46 |
| 2014/0144200 A1 | * | 5/2014 | Muller ............... B21D 35/005 72/364 |
| 2014/0170432 A1 | * | 6/2014 | Isaka ............... C23C 14/022 428/546 |
| 2015/0040639 A1 | | 2/2015 | Sasaki et al. |
| 2016/0122877 A1 | * | 5/2016 | Wang ............... C23C 28/345 427/180 |
| 2017/0291211 A1 | * | 10/2017 | Yamamoto ........... B21D 22/022 |

FOREIGN PATENT DOCUMENTS

| | | | |
|---|---|---|---|
| JP | 63-21737 B2 | 5/1988 | |
| JP | 2000-271699 A | 10/2000 | |
| JP | 2001-71086 A | 3/2001 | |
| JP | 2012-115869 A | 6/2012 | |
| JP | 2015-155115 A | 8/2015 | |
| WO | WO1987001395 A1 * | 3/1987 | ............. C23C 19/03 |

OTHER PUBLICATIONS

Written Opinion of the International Searching Authority, International Application No. PCT/JP2016/078611, dated Nov. 8, 2016, 3 pp.

* cited by examiner

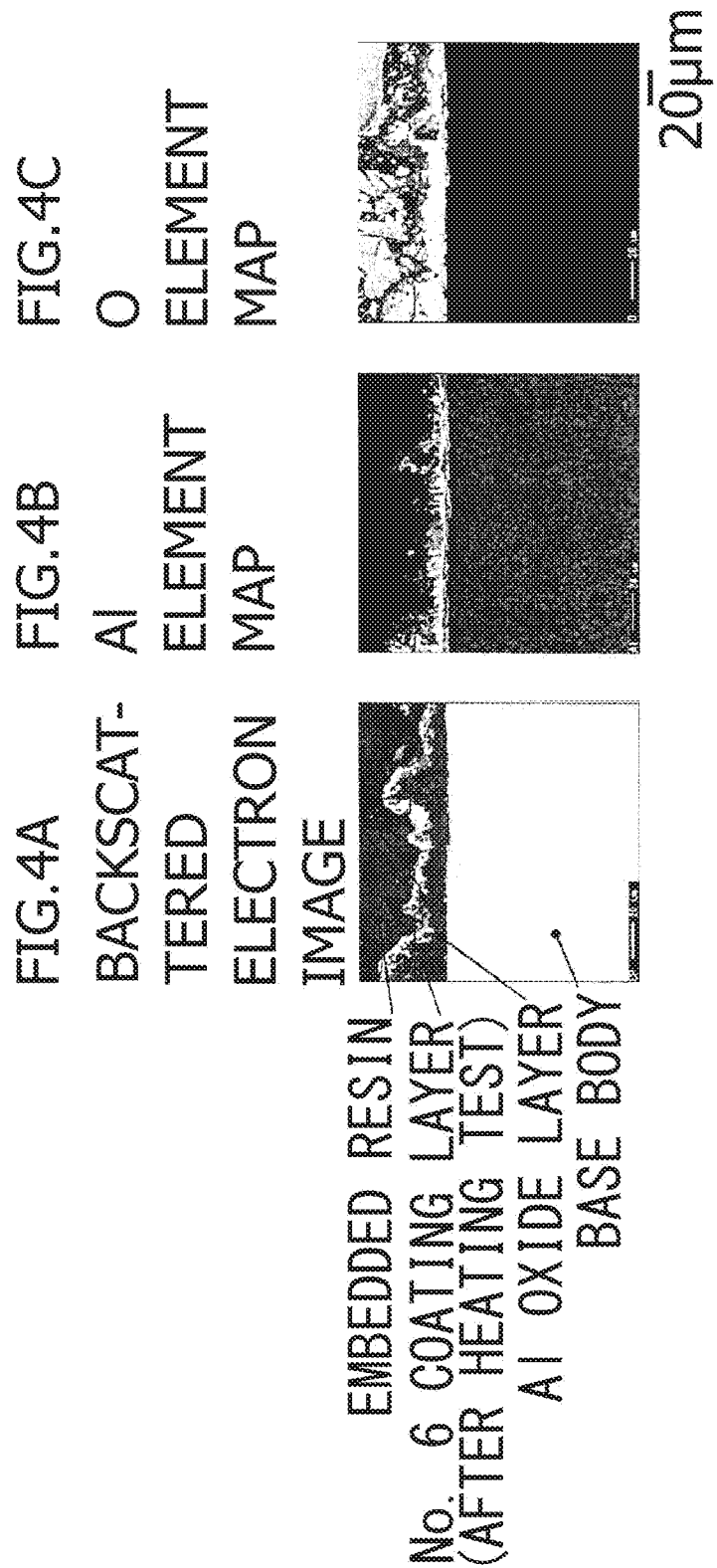

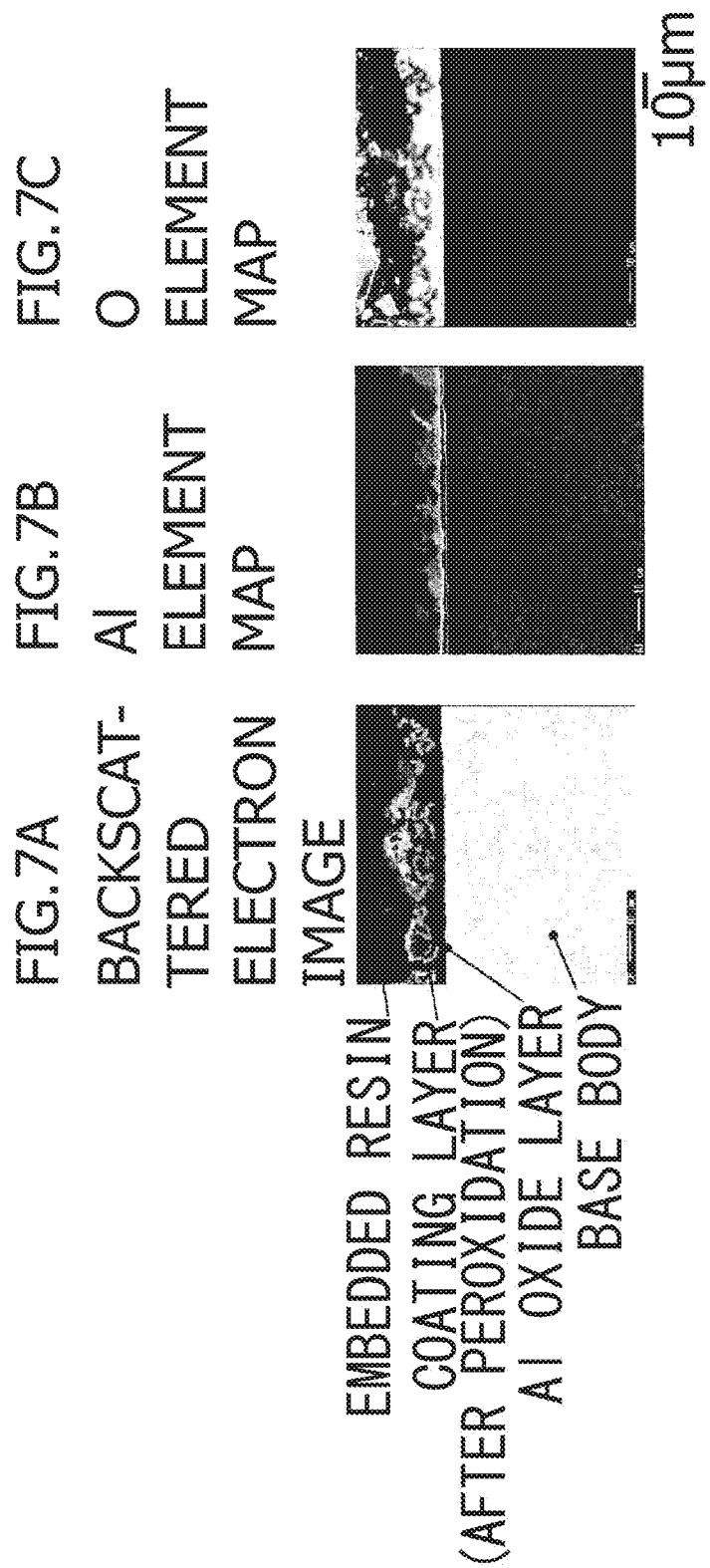

HOT FORGING DIE AND MANUFACTURING PROCESS FOR FORGED PRODUCT USING THE SAME, AND MANUFACTURING PROCESS FOR HOT FORGING DIE

RELATED APPLICATIONS

This application is a 35 U.S.C. § 371 national stage application of PCT Application No. PCT/JP2016/078611, filed on Sep. 28, 2016, which itself claims priority from Japanese Patent Application No. 2016-114023, filed on Jun. 8, 2016, Japanese Patent Application No. 2016-063818, filed on Mar. 28, 2016 and Japanese Patent Application No. 2015-191750, filed on Sep. 29, 2015, the contents of all of which are incorporated herein by reference in their entireties. The above-referenced PCT International Application was published as International Publication No. WO 2017/057453 A1 on Apr. 6, 2017.

TECHNICAL FIELD

The present invention relates to a hot forging die having a high oxidation resistance and a manufacturing process for a forged product using the same, and to a manufacturing process for a hot forging die.

BACKGROUND ART

In forging a product made of a heat-resistant alloy, a forging material is heated to lower its deformation resistance. Since the heat-resistant alloy shows high strength even at high temperature, a hot forging die for forging the alloy is required to have high mechanical strength at high temperature.

Also, at the time of hot forging, if the temperature of the hot forging die is lower than a forging material, the forging material is reduced in workability due to die chilling. Thus, a product made of a poor workability material, such as Alloy 718 or Ti alloy, is forged by heating the hot forging die as well as the workpiece. Accordingly, the hot forging die must have high mechanical strength at high temperature that is equal or close to the temperature of the forging material. Proposed as a hot forging die that satisfies the above requirements is a Ni-based superalloy. This alloy can withstand hot forging in the air with the die temperature of 1000° C. or more (see, for example, Patent Documents 1 to 3).

Note that the hot forging specified herein encompasses hot die forging and isothermal forging. In the hot die forging, the temperature of the hot forging die is set close to that of the forging material, and in the isothermal forging, this temperature is set equal to that of the forging material.

REFERENCE DOCUMENT LIST

Patent Documents

Patent Document 1: JP S62-50429 A
Patent Document 2: JP S63-21737 B
Patent Document 3: U.S. Pat. No. 4,740,354

SUMMARY OF THE INVENTION

Problem to be Solved by the Invention

The above Ni-based superalloy is advantageous in terms of high-temperature compressive strength. Regarding the oxidation resistance, however, it faces a problem that fine scales of nickel oxide are scattered from the die surface during cooling after heating in the air, possibly leading to deteriorations in working environment and die shape. The oxidation of the die surface and its resultant scattering of scales become obstacles in maximizing a beneficial effect that the die can be used in the air.

An object of the present invention is to provide a hot forging die and a manufacturing process for a forged product using the same, and a manufacturing process for a hot forging die, which make it possible to prevent oxidation of the surface of a die made of the Ni-based superalloy to overcome the problems about deteriorations in working environment and die shape and also to suppress decline in oxidation resistance that might occur after repeated use.

Means for Solving the Problem

The inventors of the present invention have examined the problems about the oxidation of the die surface and resultant scattering of scales, and found that these problems can be significantly controlled by use of an inorganic material for coating of the die surface and eventually accomplished the present invention.

More specifically, the present invention provides a hot forging die comprising: a base body made of a Ni-based superalloy having a composition consisting of, by mass, 10.3 to 11.0% of W, 9.0 to 11.0% of Mo, and 5.8 to 6.8% of Al and balance of Ni with inevitable impurities; and a coating layer of inorganic material that is formed on at least one of a forming surface and a side surface of the die and contains 30 mass % or more in total of one or more of Si, Cr, and Al out of Si and metal elements.

Preferably, the coating layer of inorganic material is formed on the entire surface of the hot forging die.

Preferably, the coating layer consists of one or more of nitride, oxide, and carbide.

Preferably, the coating layer contains at least nitride and in the nitride, Cr accounts for 50 mass % or more of elements other than nitrogen.

Preferably, the coating layer contains at least oxide and in the oxide, Si accounts for 50 mass % or more of elements other than oxygen Preferably, the coating layer contains at least carbide and in the carbide, Si accounts for 50 mass % or more of elements other than carbon.

Preferably, the coating layer comprises a mixed phase of carbide and oxide, and in the mixed phase of carbide and oxide, Si accounts for 30% mass or more of elements other than carbon and oxygen.

Preferably, the coating layer has a laminate structure of two or more layers different in composition.

More preferably, in the hot forging die, an Al oxide layer is formed between the surface of the base body for hot forging and the coating layer.

Also, the present invention provides a manufacturing process for a forged product, comprising hot-forging a heated forging material by use of an upper die and a lower die, each of which comprises the aforementioned hot forging die.

Also, the present invention provides a manufacturing process for a hot forging die using a Ni-based superalloy as a base body, the process comprising applying an inorganic material containing one or more of nitride, oxide, and carbide onto at least one of a forming surface and a side surface of the base body made of the Ni-based superalloy to form a coating layer, the Ni-based superalloy consisting of, by mass, 10.3 to 11.0% of W, 9.0 to 11.0% of Mo, and 5.8 to 6.8% of Al and balance of Ni with inevitable impurities.

Also, the manufacturing process for a hot forging die comprises heating the base body having the inorganic material applied thereon to form an Al-enriched oxide layer between the surface of the base body and the coating layer.

Effects of the Invention

The hot forging die of the present invention has a beneficial effect of preventing the oxidation of the die surface and resultant scattering of scales because of high oxidation resistance. Also, the effect is not reduced so much even after repeated use. Further, in hot forging in the air with this mold, a beneficial effect of suppressing deteriorations in working environment and die shape can be provided.

BRIEF DESCRIPTION OF THE DRAWINGS

FIGS. 4A to 4C are photographs of cross-sectional structure showing a backscattered electron image, taken by an electron microscope, of an Al oxide layer as a self-oxidized layer of the present invention; an Al element map; and an O (oxygen) element map.

FIGS. 7A to 7C are photographs of cross-sectional structure showing a backscattered electron image taken by an electron microscope, which indicates that an Al oxide layer is formed through preheating; an Al element map; and an O (oxygen) element map.

MODE FOR CARRYING OUT THE INVENTION

Figure 1:
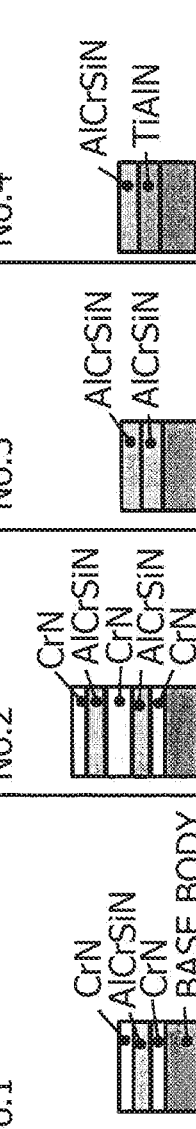
FIG. 1 shows cross-sectional schematic diagrams of coating layers.

First of all, a chemical composition of a hot forging die according to the present invention is described. A Ni-based superalloy having the following alloy composition defined herein, has higher high-temperature compressive strength than the other hot forging die materials and can withstand hot forging such as hot die forging or isothermal forging in the air. Its units are given in mass %.

W can be dissolved into austenitic matrix and also into $Ni_3Al$ type gamma prime phase as a precipitation strengthening phase to enhance the high-temperature strength of the alloy. Also, W functions to precipitate body-centered cubic $\alpha$—(Mo, W) phase of a solid solution of W and Mo to a grain boundary so as to enhance grain boundary strength of the alloy as well as the machinability of the alloy. On the other hand, W functions to reduce oxidation resistance as well and if an added amount exceeds 11.0%, cracks are likely to occur. From the viewpoint of enhancing the high-temperature strength, suppressing decline in oxidation resistance, and suppressing cracks more than ever, the W content in the Ni-based superalloy of the present invention is set to 10.3 to 11.0%. A preferred lower limit of the W content is 10.4%, which ensures the beneficial effect of W more reliably. A preferred upper limit thereof is 10.7%.

Mo can be dissolved into austenite matrix and also into $Ni_3Al$ type gamma prime phase as a precipitation strengthening phase to enhance the high-temperature strength of the alloy. On the other hand, Mo functions to reduce the oxidation resistance. From the viewpoint of enhancing the high-temperature strength and suppressing reduction in oxidation resistance more than ever, the Mo content in the Ni-based superalloy of the present invention is set to 9.0 to 11.0%. A preferred lower limit of Mo content, which ensures the beneficial effect of Mo more reliably, is 9.5%, more preferably 9.8%. Moreover, an upper limit thereof is preferably 10.5%, more preferably 10.2%.

Al is bound to Ni, allowing precipitation of $Ni_3Al$ gamma prime phase to enhance the high-temperature strength of the alloy, form an alumina layer on the alloy surface, and give an oxidation resistance to the alloy. On the other hand, it has an opposite effect that the excessively large Al content produces an excessive amount of eutectic gamma prime phase, lowering the high-temperature strength of the alloy. With a view to enhancing the oxidation resistance and high-temperature strength, the Al content in the Ni-based superalloy of the present invention is set to 5.8 to 6.8 mass %. A preferred lower limit that ensures beneficial effects of Al more reliably is 6.0%, more preferably 6.1%. An upper limit of the Al content is preferably 6.6%, more preferably 6.4%.

The alloy basically consists of Al, W, and Mo as essential components and the balance of Ni with inevitable impurities. In the Ni-based superalloy of the present invention, Ni is a main element of gamma phase. Also, Ni forms a gamma prime phase together with Al, Mo, and W.

The Ni-based superalloy of the present invention may contain components other than Ni, Mo, W, and Al as inevitable impurities.

According to the present invention, a coating layer of an inorganic material is formed on a base body for the hot forging die, which has the above alloy composition.

The purpose of formation of the coating layer of inorganic material on the hot forging die having the above alloy composition is to prevent scales from peeling off. The surface of the hot forging die is covered with a dense protective coating film (coating layer) to thereby protect a base material of the die from direct contact with oxygen in the air at high temperatures and prevent oxidation of the die surface. Thus, according to the present invention, an inorganic material is applied into a layer to form a coating layer of the inorganic material and prevent the oxidation of the hot forging die.

Also, according to the present invention, the coating layer contains 30 mass % or more in total of at least one of Si, Cr, and Al out of Si and metal elements. This is because the coating layer of inorganic material that contains 30 mass % or more of one or more of these elements has a high effect of preventing oxidation, especially, of the die surface. Note that the "coating layer of inorganic material" specified herein indicates one formed by application, spraying, deposition, etc., not an oxidized layer like a self-oxidized layer, which is spontaneously formed on the top surface of the hot forging die during heating prior to hot forging or during hot forging. The above statement "coating layer contains 30 mass % or more in total of at least one of Si, Cr, and Al out of Si and metal elements" defines that the coating layer is other than the self-oxidized layer that is spontaneously formed during a hot forging process.

To describe a method of applying an inorganic material, the deposition enables dense and uniform application of an inorganic material by, for example, physical vapor deposition (PVD). This method is particularly appropriate for the formation of a coating layer having a multi-layer structure. Also, applying and spraying methods are cost effective and suitable for the formation of a coating layer having a single-layer structure.

Also, as described above, the "coating layer of inorganic material" specified herein is not an oxidized layer of the alloy component but is a single layer selected from an oxide layer, a nitride layer, and an oxide layer containing carbide, which have different composition from the alloy component, or a composite layer including two or more of the above layers. Note that the oxide layer as the inorganic material does not contain a so-called glass lubricant. The "coating layer of inorganic material" of the present invention does not include one that almost loses its effect after one hot forging process like the glass lubricant.

According to the present invention, the coating layer of inorganic material is formed on either or both of the forming surface and the side surface of the die. This is because these two surfaces are generally exposed to the high-temperature air atmosphere. In the present invention, the coating layer of inorganic material can be formed on either or both of the forming surface and the side surface of the die, but in order to more reliably ensure the effect of preventing scales from peeling off, it is preferred to form the coating layer of inorganic material on both of the forming surface and the side surface of the die. Note that the "forming surface" of the present invention indicates a surface against which a to-be-forged material is pressed for hot forging. For example, this surface can be flat like a so-called anvil or can have a die face.

In the present invention, in order to further ensure the effect of preventing scales from peeling off, it is preferred to form a coating layer of inorganic material on all surfaces (forming surface, side surface of the die, and bottom surface of the die) of the hot forging die. As a result, it is possible to more reliably prevent oxidation of the die surface that might be caused by contact between a base material of the die and oxygen in the air at high temperatures, and its resultant scattering of scales and in turn, to avoid deteriorations in working environment and die shape.

The above coating layer of inorganic material preferably consists of one or more of nitride, oxide, and carbide. This is because a coating layer made of nitride, oxide, or carbide forms a dense oxygen barrier layer to prevent oxidation of a base material of the die. Then, according to the present invention, the coating layer is formed of the inorganic material to prevent scales from peeling off. Note that the coating layer may be a single layer made of nitride, oxide, or carbide or may be of a laminate structure having a combination of two or more of nitride, oxide, and carbide. A mixed phase of carbide and oxide can produce the same effect as well.

Also, in the case of forming a coating layer on plural surfaces or in selected areas of a certain surface, it might be more advantageous to form different coating layers for the respective surfaces or areas in terms of layer formation costs, properties, and workability. Among these options, a desired one can be selected in consideration of the costs and the effect of preventing scales from peeling off.

Regarding the nitride in the coating layer, it is preferable to select Cr-based nitride in which Cr accounts for 50 mass % or more of elements other than nitrogen. This is because the Cr-based nitride shows a high oxidation resistance at high temperatures. Regarding the oxide in the coating layer, it is preferable to use oxide in which Si accounts for 50 mass % or more of elements other than oxygen. Regarding the carbide in the coating layer, it is preferable to use carbide in which Si accounts for 50 mass % or more of elements other than carbon. Regarding the mixed phase of carbide and oxide, it is preferable to use a mixed phase in which Si accounts for 30 mass % or more of elements other than carbon and oxygen. These coating layers can also produce an effect of improving oxidation resistance at high temperatures.

According to the present invention, the coating layer may have the multi-layer structure of two or more layers having different compositions. For example, if the multi-layer structure of two or more nitride layers having different compositions is adopted, the combination of the layers of different compositions in the coating layer makes it possible to improve the oxidation resistance, adhesion, service life, and other such properties.

It is more preferable to form an Al oxide layer between the base body surface and the coating layer. The Al oxide layer is a self-oxidized layer that is formed in such a way that Al in the base body (base material) for the hot forging die is self-oxidized. For example, in the case of coating a to-be-forged material with the glass lubricant, the glass lubricant might corrode the coating layer, or the coating layer and the base material. At that time, if the Al-based self-oxidized layer exists at the interface with the base material, the self-oxidized layer functions as a barrier layer that prevents the progress of corrosion with the glass lubricant. Note that the self-oxidized layer can be formed by executing pre-oxidation after the formation of the coating layer of inorganic material on the surface of the base material.

The above Al-based self-oxidized layer
can be obtained through pre-oxidation at 900 to 1100° C. for 3 to 5 hours, for example. If the conditions for the pre-oxidation differ from those for preheating of the hot forging die, which is executed prior to the hot forging, pre-oxidation has to be additionally executed so as to form a self-oxidized layer.

Moreover, in the present invention, the thickness of each layer in the coating layer is preferably 2 to 200 µm. Although properties vary depending on the type of inorganic material, it is preferred that each layer in the coating layer have the thickness of 2 to 200 µm, by which properties of the coating layer can be exhibited fully. This is because if the thickness of each layer is too small, there is a possibility that an effect of forming a coating layer is lowered, whereas if the coating layer is too thick, the effect is saturated or the cost is increased.

EXAMPLES

Example 1

The present invention is described in more detail in Examples below. An ingot of Ni-based superalloy shown in Table 1 was prepared by vacuum melting. Here, the alloy having the composition of Table 1 has superior properties, i.e., high-temperature compressive strength as shown in Table 2. In this way, the alloy exhibits properties suitable for a hot forging die. Note that the high-temperature compressive strength (compressive resistance) was tested at 1100° C.

TABLE 1

| (mass %) | | | |
|---|---|---|---|
| W | Mo | Al | Balance |
| 10.5 | 10.0 | 6.3 | Ni and inevitable impurities* |

*Inevitable impurities (O: 5 ppm, N: 2 ppm, C: 0.016%, Si: 0.008%, P: 0.001%, S: <0.001%, Cr: 0.001%, Mn: 0.008%, Fe: 0.01%, Co: 0.001%, and Cu: <0.001%)

TABLE 2

| Strain rate (1/sec) | Compressive resistance (MPa) |
|---|---|
| 0.001 | 460 |
| 0.01 | 570 |
| 0.1 | 580 |

A disk-like test piece having 50 mm in diameter and 10 mm in height was cut out of the above ingot. After one circular surface of the test piece was polished close to #500 surface, a coating layer of inorganic material was formed on the polished surface to prepare the test piece. The test piece was examined of an effect of preventing oxidation of the die surface and scattering of scales, which could be obtained from the formation of the coating layer. The test piece prepared in this example simulates the surface of the hot forging die, which is free from any stress. Also, the coating layer was formed only on one circular surface. Table 3 summarizes the composition, the layer structure, and the thickness of each layer of the coating layer. A No. 1 test piece has a coating layer of three CrN— or AlCrSiN-based layers: a CrN layer, an AlCrSiN layer, and a CrN layer. A No. 2 test piece has a coating layer of five-layer structure consisting of an AlCrSiN layer and a CrN layer in addition to the three layers of the No. 1 test piece. A No. 3 test piece has a coating layer of two-layer structure, i.e., two AlCrSiN layers. A No. 4 test piece has a coating layer of two-layer structure: a TiAlN layer and an AlCrSiN layer. These coating layers were formed by PVD. Also, a No. 5 test piece has a coating layer containing 25 to 27 mass % of colloidal silica and 73 to 75 mass % of SiC. A No. 6 test piece has a coating layer made of ceramics having the composition shown in Table 4. These coating layers were formed by applying a coating material. Although the No. 5 coating material contains water and the No. 6 coating contains an organic material such as ethanol, these elements are removed from the coating layer by evaporation, for example, in a temperature range of 900 to 1100° C. in which deteriorations in working environment and die shape, caused by oxidation of the Ni-based superalloy shown in Table 1, could result in serious troubles. In Table 3, the left side of the "layer structure" of each layer is close to the base material (Ni-based superalloy) and the right end thereof is close to the top surface. Regarding the "thickness of each layer" in Table 3, if plural layers of the same composition are formed as a coating layer, these are assumed to have the same thickness. In this case, the "thickness of each layer" indicates the thickness of any one of the plural layers.

One of the methods to determine the composition of a coating layer formed on the test piece is quantitative analysis with energy dispersive X-ray spectrometry (hereinafter referred to as "EDX"). Since the coating layers of the Nos. 1 to 4 test pieces were affected by the components of the base material because of their small thickness, an accurate value was not obtained through quantitative analysis with the EDX. Therefore, considering the compositions of the coating layer of these test pieces, it was determined that the coating layer of each test piece contains 30 mass % or more in total of one or more of Si, Cr, and Al among Si and metal elements. Regarding the Nos. 5 and 6 test pieces, the quantitative analysis with the EDX revealed that the coating layer contains 30 mass % or more of Si alone or 30 mass % or more in total of Si and Al.

TABLE 3

| No. | Composition of coating layer | Layer structure | Thickness of each layer (μm) |
|---|---|---|---|
| 1 | CrN and AlCrSiN* | CrN—AlCrSiN—CrN | CrN: 2.25 AlCrSiN: 3.5 |
| 2 | CrN and AlCrSiN* | CrN—AlCrSiN—CrN—AlCrSiN—CrN | CrN: 2.25 AlCrSiN: 3.5 |
| 3 | AlCrSiN* | AlCrSiN—CrN—AlCrSiN | AlCrSiN: 3.5 |
| 4 | TiAlN and AlCrSiN* | TiAlN—AlCrSiN | TiAlN: 4 AlCrSiN: 3.5 |
| 5 | SiC and $SiO_2$ | (SiC + $SiO_2$) | 20 to 30 |
| 6 | Ceramics | Ceramics (composition shown in Table 4) | 100 to 150 |

*Cr accounts for 45 mass % of elements other than nitrogen.

TABLE 4

| (mass %) | | | | |
|---|---|---|---|---|
| $SiO_2$ | $B_2O_3$ | $Al_2O_3$ | CaO | Balance |
| 53.0 | 5.6 | 12.7 | 18.0 | Slightly added oxides, etc. * |

* Slightly added oxides ($Na_2O$: 0.6%, $K_2O$: 0.1%, $Fe_2O_3$: 0.2%, MgO: 0.5%, $TiO_2$: 0.6%, and SrO: 0.2%)

The above Nos. 1 to 6 test pieces and a comparative example with no coating layer of inorganic material were subjected to a heating test. More specifically, they were put in a furnace heated at 1100° C. and held at 1100° C. for three hours and then taken out of the furnace and air-cooled. The heating test was repeatedly executed in such a manner that the test piece or comparative example was cooled and then put in the furnace again, in order to evaluate reduction of the oxidation resistance after repeated use. At the time when a coating layer was completely peeled off, the test of a target test piece was stopped. The test was repeated up to ten times. FIG. 1 shows schematic diagrams of coating layers of the Nos. 1 to 6 test pieces. Note that the comparative example used was polished in the same way with the same shape as the Nos. 1 to 6 test pieces.

Figure 2A:
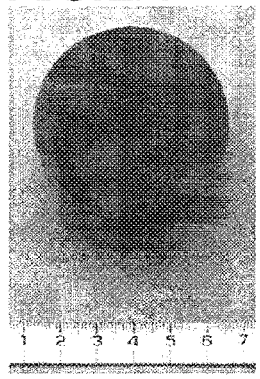
FIGS. 2A to 2G are photographs of appearances showing an effect of suppressing oxidation and resultant scattering of scales.
Figure 2B:
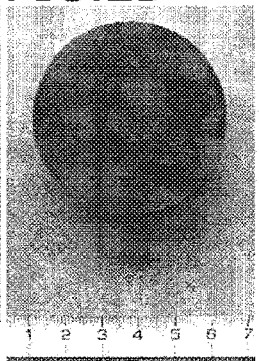
Figure 2C:
Figure 2D:
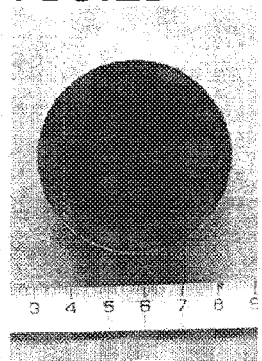
Figure 2E:
Figure 2F:
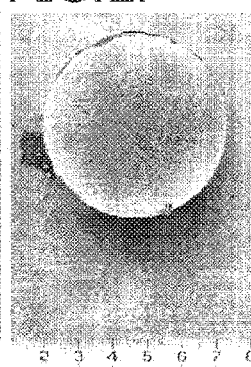
Figure 2G:
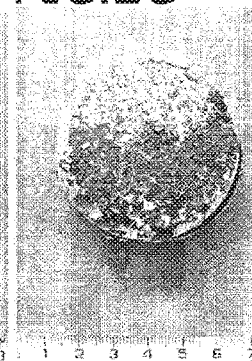

FIG. 2A is a photograph showing the surface for evaluation (evaluation surface) of the No. 1 test piece surface; FIG. 2B, the evaluation surface of the No. 2 test piece; FIG. 2C, the evaluation surface of the No. 3 test piece; FIG. 2D, the evaluation surface of the No. 4 test piece; FIG. 2E, the evaluation surface of the No. 5 test piece; FIG. 2F, the evaluation surface of the No. 6 test piece; and FIG. 2G, the evaluation surface of the comparative example. These test pieces were subjected to one heating test. A black portion of the surface of the comparative example indicates peeled, fine scales. This shows that the surface of the comparative example was oxidized and consequently, scales were scattered. In contrast, it can be understand that in all of the Nos. 1 to 6 test pieces as Examples of the present invention, the oxidation of the surface was suppressed by the coating layer and also, the oxidation of the base material of the die and resultant scattering of scales were prevented at the evaluation surface.

Figure 3A:
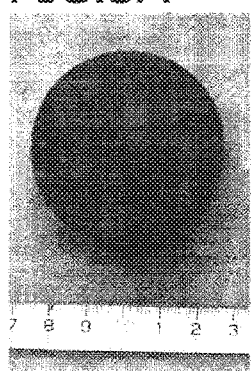
FIGS. 3A to 3G are photographs of appearances showing an effect of suppressing reduction in oxidation resistance that might occur due to repeated heating and cooling.
Figure 3B:
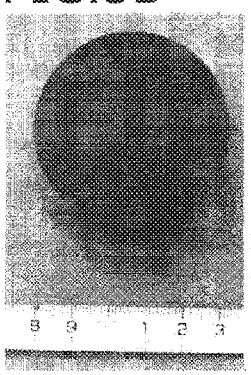
Figure 3C:
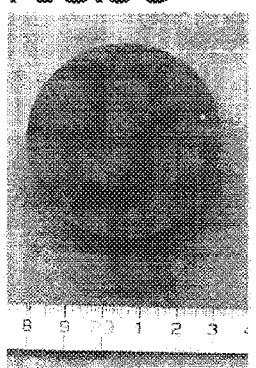
Figure 3D:
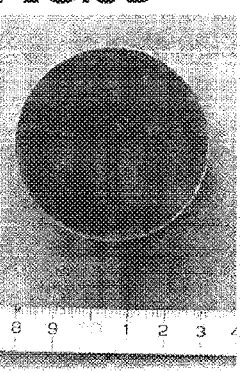
Figure 3E:
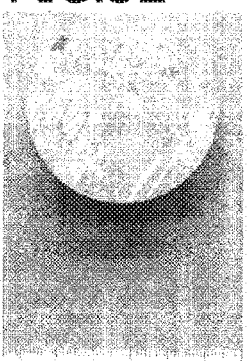
Figure 3F:
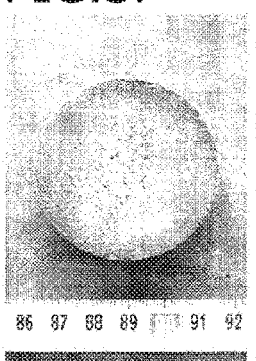
Figure 3G:
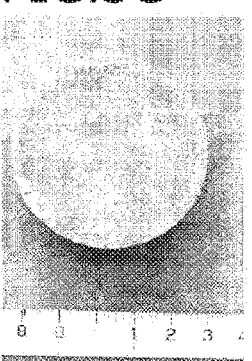

FIG. 3A is a photograph showing the No. 1 test piece; FIG. 3B, the No. 2 test piece; FIG. 3C, the No. 3 test piece;

and FIG. 3F, the No. 6 test piece. These test pieces were subjected to ten heating tests. The coating layers of these Examples were not peeled off after the heating test was repeated ten times. FIG. 3D is a photograph showing the No. 4 test piece after the ten heating tests. The coating layer of the No. 4 test piece was gradually peeled off after the seventh heating test. FIG. 3E is a photograph showing the No. 5 test piece after the fourth heating test. The coating layer of the No. 5 test piece was gradually peeled off after the first heating test and completely peeled off at the fourth test. Thus, the heating test of the No. 5 test piece was stopped at the time of the fourth test. FIG. 3G is a photograph showing a comparative example after ten heating tests. The comparative example suffered from oxidation of the surface and resultant scattering of scales throughout the first to tenth heating tests.

The above results reveal that the Nos. 1 to 4 and 6 test pieces were free of reduction in antioxidant effect that might be caused by peeling of the coating layer, throughout the first to tenth heating test. Also, in the No. 5 test piece, the coating layer was peeled off a little, but oxidation was prevented in a region covered with the unpeeled coating layer at the first to third heating tests. This suggests that the coating layer of the No. 5 test piece can maintain a sufficient oxidation resistance if reapplied after about two or three uses.

Regarding the costs for forming a coating layer of inorganic material, the process of applying an inorganic material as in the Nos. 5 and 6 test pieces requires lower costs than the PVD as in the Nos. 1 to 4 test pieces. Also, the coating layer of the No. 5 test piece was completely peeled off at the time of fourth test, while the coating layer of the No. 6 test piece was not peeled even after the test was repeated ten times and thus, the reapplication was unnecessary. Accordingly, the No. 6 test piece is advantageous in terms of workability, compared with the No. 5 test piece. The coating layer of the No. 6 test piece is more preferred for the actual use.

FIG. 4A is a backscattered electron image, observed in cross-section by FE-EPMA, of a test sample produced by embedding into a resin a coating layer of the No. 6 test piece subjected to the ten heating tests and the base material and then applying mirror polishing thereto. FIG. 4B shows an element map of Al. FIG. 4C shows an element map of O. The gradation of the element map image corresponds to the concentration of a target element (element to be measured). The more the white level, the more the concentration. As understood from these images, Al and O were contained in high concentration at the base material surface on the coating layer side, and an Al oxide layer was formed there. The Al oxide layer was formed by applying a ceramic coating of the No. 6 test piece and then holding the resultant at 1100° C. for 3 hours. After subjected to the heating test for holding at 1100° C. for 3 hours and the subsequent heating test that was repeated ten times, the No. 6 test pieces showed high oxidation resistance, which was due to the formation of the coating layer of the No. 6 test piece and an Al oxide layer formed by heating on the base material surface on the coating layer side.

Example 2

In forging a to-be-forged material covered with a glass lubricant by use of a hot forging die with a coating layer, the glass lubricant might corrode the coating layer or the coating layer and the base material.

First, in order to evaluate corrosion of the base material with the glass lubricant, three test pieces were prepared by applying 400 to 500 mg of glass lubricant to around the center of a sample that was processed in the same way as the comparative example. The resultant test pieces were each subjected to one heating test, in which the test piece was put in the heated furnace and held for three hours and then, taken out of the furnace and air-cooled, at 900, 1000, and 1100° C. that are possible temperatures in the actual use. Note that the atmosphere for the heating test was an air atmosphere and also, all subsequent tests were performed in the air atmosphere. FIG. 5 shows compositions of the glass lubricant used herein. Also, the EDX quantitative analysis confirmed that Si and Al accounted for 30 mass % or more in total.

TABLE 5

(mass %)

| $SiO_2$ | $B_2O_3$ | $Al_2O_3$ | CaO | $Na_2O$ | $K_2O$ | Balance |
|---|---|---|---|---|---|---|
| 34.3 | 22.5 | 22.7 | 3.1 | 8.5 | 5.3 | Slightly added oxides, etc.* |

*Slighty added oxides ($Fe_2O_3$: 0.2%, and MgO: 0.1%)

Figure 5A:
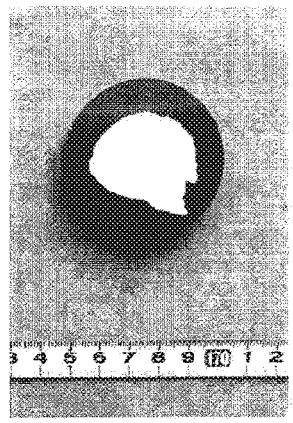
FIGS. 5A to 5F are photographs of appearances showing corrosion of a base material caused by a glass lubricant.
Figure 5B:
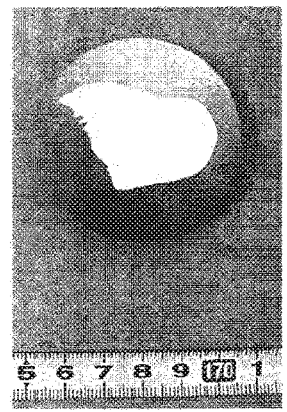
Figure 5C:
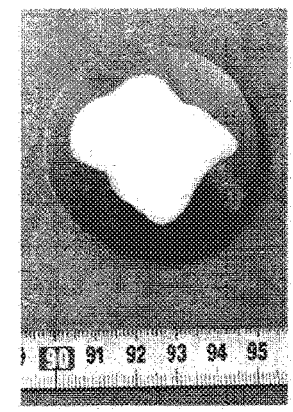
Figure 5D:
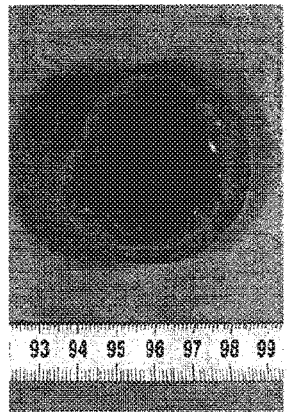
Figure 5E:
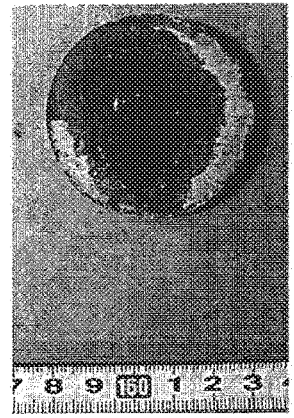
Figure 5F:

FIG. 5A is a photograph showing a sample before the heating test at 900° C. FIG. 5D is a photograph showing a sample after the heating test at 900° C. FIG. 5B is a photograph showing a sample before the heating test at 1000° C.; FIG. 5E, after the heating test at 1000° C.; FIG. 5C, before the heating test at 1100° C.; and FIG. 5F, after the heating test at 1100° C. As understood from the photographs, the base material was corroded by the glass lubricant at all of 900, 1000, and 1100° C. and the degree of reaction increased as the temperature increased.

Next, in order to evaluate the corrosion of the hot forging die with the coating layer of the No. 6 test piece, a test piece was prepared in the same way as the No. 6 test piece and subjected to pre-oxidation so as to form an Al-based self-oxidized layer and then, applied with 400 to 500 mg of glass lubricant at around the center of the test piece on the coating layer. In this way, the test piece was completed. The test piece simulates such a state that the glass lubricant applied onto the to-be-forged material remains on the die coated with the coating layer of the No. 6 test piece and preheated. This test piece was subjected to one heating test in which the test piece was put in the furnace heated at 1100° C. at which the most serious corrosion with the glass lubricant was seen, and held for three hours at 1100° C. and then, taken out of the furnace and air-cooled. Table 6 shows pre-oxidation conditions of the test piece and the thickness of the coating layer.

TABLE 6

| No. | Pre-oxidation condition | Layer thickness (μm) |
|---|---|---|
| 7 | Holding at 900° C. for 1 hour and holding at 1100° C. for 3 hours | 30 to 70 |

Figure 6A:
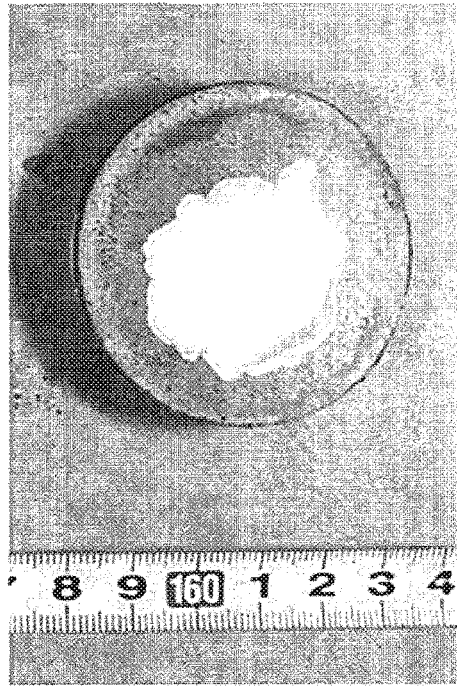
FIGS. 6A and 6B are photographs of appearances showing how the coating layer suppresses the corrosion.
Figure 6B:
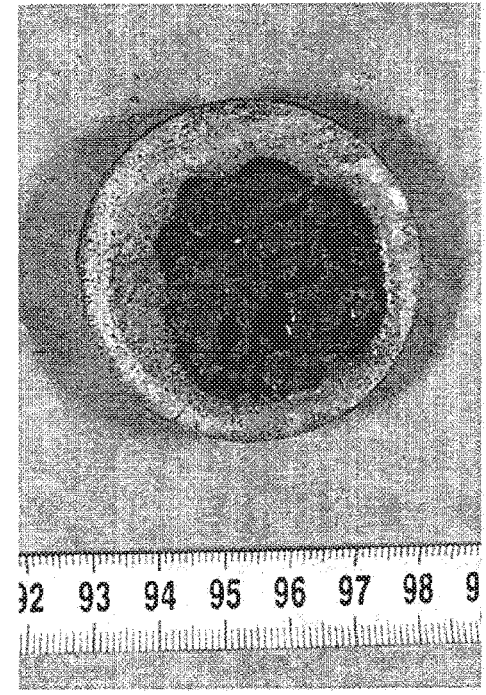
Figure 8A:
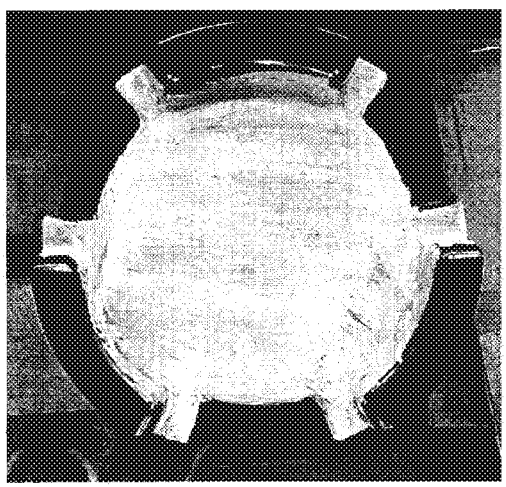
FIGS. 8A and 8B are photographs of appearances of a hot forging die of which a forming surface is coated with a coating layer, before and after isothermal forging.
Figure 8B:
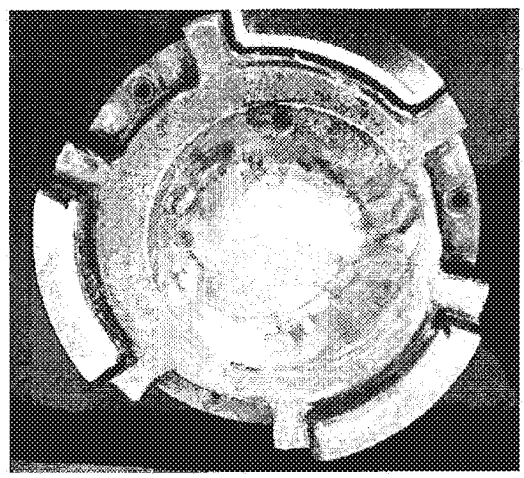

FIGS. 6A and 6B are photographs showing the No. 7 test piece before and after the heating test, respectively. As understood from these photographs, the base material and the coating layer were less corroded by the glass lubricant in the No. 7 test piece.

FIG. 7A is a backscattered electron image, observed in cross-section by FE-EPMA, of a test sample produced by embedding into a resin a coating layer of the No. 7 test piece after pre-oxidation and the base material and then applying mirror polishing thereto. FIG. 7B shows an element map of Al. FIG. 7C shows an element map of O. As understood from these images, Al and O were contained in high concentration at the base material surface on the coating layer side, and an Al oxide layer was formed between the base material and the coating layer through the pre-oxidation. The reason that the coating layer of the No. 7 test piece and the base material were less corroded by the glass lubricant is because of the Al oxide layer.

Next, a die of 300 mm diameter and 100 mm height was prepared, which had the composition of Table 7 with the coating layer of the No. 6 test piece formed on the forming surface to which the stress was to be applied. Then, the die was evaluated of the effect of preventing the oxidation of the coating layer of the No. 6 test piece and scattering of scales at the forming surface and the effect of preventing corrosion by the glass lubricant.

TABLE 7

| (mass %) | | | |
|---|---|---|---|
| W | Mo | Al | Balance |
| 10.6 | 9.9 | 6.1 | Ni and inevitable impurities* |

*Inevitable impurities (O: 1 ppm, N: 2 ppm, C: 0.015%, Si: 0.004%, P: <0.001%, S: <0.001%, Cr: 0.003%, Mn: 0.019%, Fe: 0.016%, Co: 0.002%, and Cu: 0.001%)

The die with the coating layer of the No. 6 test piece formed on the forming surface was used for isothermal forging under the condition that the die and workpiece were both heated at 980° C. An Ni-based alloy was used as the to-be-forged material, and the glass lubricant was used as a lubricant. The stress of up to about 150 MPa was applied to the forming surface of the die. This isothermal forging was performed twice. The pre-oxidation prior to the forging was to hold at 900° C. for 1 hour and at 980° C. for 1 hour. FIG. 5A is a photograph showing a forming surface of the die applied with a ceramic coating of the No. 6 test piece. FIG. 5B is a photograph showing a forming surface of the die after the isothermal forging. As understood from these photographs, although it was observed that the coating layer formed on the forming surface of the die was slightly peeled off inside the die face due to the isothermal forging, a sufficient amount of coating layer remained unpeeled. This reveals that the oxidation of the base material of the die and resultant scattering of scales could be prevented and also, the corrosion with the glass lubricant was suppressed at almost all the forming surface due to the presence of the coating layer of the No. 6 test piece.

The above results show that the hot forging die with a coating layer of inorganic material of the present invention, which is made of a Ni-based superalloy consisting of, by mass, 10.3 to 11.0% of W, 9.0 to 11.0% of Mo, and 5.8 to 6.8% of Al and the balance of Ni with inevitable impurities, is superior to one with no coating layer in that the oxidation of the die surface and resultant scattering of scales can be prevented because of its high oxidation resistance and in that the coating layer is not peeled off even after being repeatedly heated and cooled, depending on the type of coating layer, and the oxidation resistance is not lowered so much.

The invention claimed is:

1. A hot forging die for a heat-resistant Ni-based alloy product, the hot forging comprising hot die forging or isothermal forging, the hot forging die comprising:
   a base body made of a Ni-based superalloy having a composition consisting of, by mass, 10.3 to 11.0% of W, 9.0 to 11.0% of Mo, and 5.8 to 6.8% of Al and balance of Ni with inevitable impurities;
   a coating layer of Cr-based nitride in which Cr accounts for 45 mass % or more of elements other than nitrogen, the coating layer being formed on at least one of a forming surface and a side surface of the die and being an outermost surface of the die; and
   an Al oxide layer formed between a surface of the base body and the coating layer.

2. The hot forging die according to claim 1, wherein the coating layer is formed on an entire surface of the hot forging die.

3. The hot forging die according to claim 1, wherein the coating layer has a laminate structure of two or more layers different in composition.

4. A manufacturing process for a forged product, comprising hot-forging a heated forging material by use of an upper die and a lower die, each of which comprises the hot forging die according to claim 1.

5. A manufacturing process for a hot forging die for a heat-resistant Ni-based alloy product by using a Ni-based superalloy as a base body, the hot forging comprising hot die forging or isothermal forging, the process comprising:
   forming a coating layer of one or more of nitride, oxide, and carbide onto at least one of a forming surface and a side surface of the die of the base body made of the Ni-based superalloy, the Ni-based superalloy consisting of, by mass, 10.3 to 11.0% of W, 9.0 to 11.0% of Mo, and 5.8 to 6.8% of Al and balance of Ni with inevitable impurities; and
   heating the base body having the coating layer at a temperature from 900 to 1100° C. to self-oxidize Al in the base body to form an Al-enriched oxide layer between the surface of the base body and the coating layer.

* * * * *